(12) United States Patent
Uetani et al.

(10) Patent No.: US 6,495,307 B2
(45) Date of Patent: Dec. 17, 2002

(54) CHEMICALLY AMPLIFIED POSITIVE RESIST COMPOSITION

(75) Inventors: Yasunori Uetani, Toyonaka (JP); Hiroaki Fujishima, Toyonaka (JP); Yoshiyuki Takata, Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/791,756

(22) Filed: Feb. 26, 2001

(65) Prior Publication Data
US 2001/0046641 A1 Nov. 29, 2001

(30) Foreign Application Priority Data
Feb. 28, 2000 (JP) .................................. 2000-051018

(51) Int. Cl.$^7$ ................................................ G03F 7/004
(52) U.S. Cl. ................................... 430/270.1; 430/910
(58) Field of Search .............................. 430/270.1, 910

(56) References Cited

U.S. PATENT DOCUMENTS

| | | |
|---|---|---|
| 5,843,624 A | 12/1998 | Houlihan et al. |
| 5,968,713 A | 10/1999 | Nozaki et al. |
| 6,013,416 A | 1/2000 | Nozaki et al. |
| 6,030,747 A | 2/2000 | Nakano et al. |
| 6,348,297 B1 * | 2/2002 | Uetani et al. ............ 430/270.1 |

FOREIGN PATENT DOCUMENTS

| | | |
|---|---|---|
| EP | 0999474 | 5/2000 |
| EP | 10 41 442 A1 | 10/2000 |
| JP | A4-39665 | 2/1992 |
| JP | A9-73173 | 3/1997 |
| JP | A1010739 | 1/1998 |
| JP | A 10-161313 | 6/1998 |
| JP | 11 30 54 44 A | 11/1999 |
| JP | B2 2973998 | 11/1999 |
| JP | A-2000 122295 | 4/2000 |

* cited by examiner

*Primary Examiner*—Rosemary Ashton
(74) *Attorney, Agent, or Firm*—Birch, Stewart, Kolasch & Birch, LLP

(57) ABSTRACT

A chemically amplified positive resist composition excellent in adhesion to a substrate, as well as good in dry-etching resistance; suitable for use in excimer laser lithography utilizing ArF, KrF or the like; and comprising a resin (X) which, per se, is insoluble in alkali but becomes soluble in alkali when subjected to an action of acid, and has a polymeric unit represented by the formula(I), a polymeric unit represented by the formula(II) and a polymeric unit represented by the formula(III):

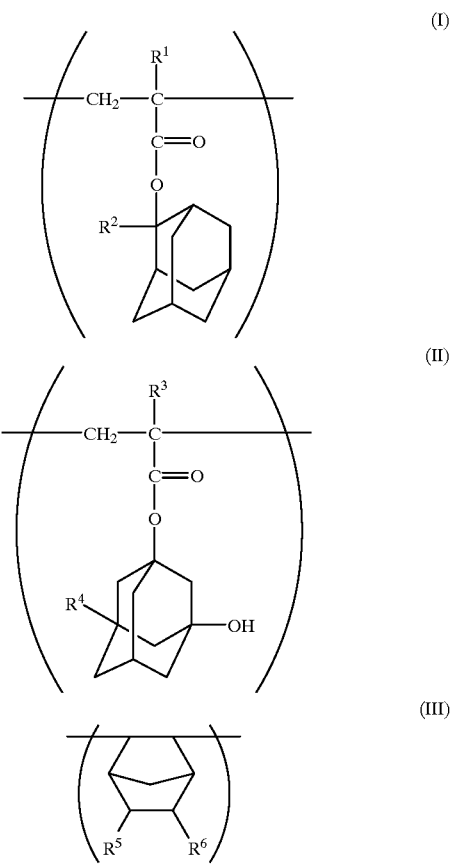

and an acid generating agent (Y).

3 Claims, No Drawings

CHEMICALLY AMPLIFIED POSITIVE RESIST COMPOSITION

BACKGROUND OF THE INVENTION

The present invention relates to a chemical amplifying type positive resist composition used in the minute processing of a semiconductor.

In general, a lithography process using a resist composition has been adopted in the minute processing of a semiconductor. In lithography, the resolution can be improved with a decrease in wavelength of exposure light in principle as expressed by the equation of Rayleigh's diffraction limited. A g-line with a wavelength of 436 nm, an i-line with a wavelength of 365 nm, and a KrF excimer laser with a wavelength of 248 nm have been adopted as exposure light sources for lithography used in the manufacture of a semiconductor. Thus, the wavelength has become shorter year by year. An ArF excimer laser having a wave length of 193nm is considered to be promising as a next-generation exposure light source.

A lens used in an ArF excimer laser exposure machine or an exposure machine using a light -source of shorter wavelength has a shorter lifetime as compared with lenses for conventional exposure light sources. Accordingly, the shorter time required for exposure to ArF excimer laser light is desirable. For this reason, it is necessary to enhance the sensitivity of a resist. Consequently, there has been used a so-called chemical amplifying type resist, which utilizes the catalytic action of an acid generated due to exposure, and contains a resin having a group cleavable by the acid.

It is known that, desirably, resins used in a resist for ArF excimer laser exposure have no aromatic ring in order to ensure the transmittance of the resist, but have an alicyclic ring in place of an aromatic ring in order to impart a dry etching resistance thereto. Various kinds of resins such as those described in Journal of Photopolymer Science and Technology, Vol. 9, No. 3, pages 387–398 (1996) by D. C. Hofer, are heretofore known as such resins. Also, use of an alternating copolymer consisting of polymeric units derived from alicyclic olefin and a polymeric unit derived from unsaturated di-carboxylic acid anhydride in a resist for an ArF excimer laser lithography is described in Proc. SPIE, Vol. 2724, pages 355–364 (1996) by T. I. Wallow et al.

However, using such a conventional resin, peeling off of the pattern is liable to occur on the developing process due to insufficient adhesion, particularly when its polarity is insufficient.

An object of the present invention is to provide a chemically amplified positive resist composition containing a resin component and an acid generating agent which is suitable for use in excimer laser lithography utilizing ArF, KrF or the like, and is satisfactory in various excellent resist performance characteristics such as sensitivity and resolution and, particularly, is excellent in adhesion to a substrate.

The inventors of the present invention have found that adhesion to a substrate is improved by using a resin having a polymeric unit derived from 2-alkyl-2-adamantyl-(meth)acrylate, a polymeric unit derived from unsaturated di-carboxylic acid anhydride, a polymeric unit derived from alicyclic olefin and the like as a part of the polymeric units in the resin composing a chemical amplifying type positive resist composition, and filed a patent application (JP-A-11-305444). They have conducted further studies and, as a result, have found that a specific resin having a polymeric unit derived from 3-hydroxy-1-adamantyl-(meth)acrylate, in addition to the above mentioned polymeric units, is more effective for improving adhesion to a substrate. The present invention was thus completed.

SUMMARY OF THE INVENTION

The present invention provides a chemically amplified positive resist composition comprising a resin (X) which, per se, is insoluble in alkali but becomes soluble in alkali when subjected to an action of acid, and has (a) a polymeric unit, derived from 2-alkyl-2-adamantyl (meth)acrylate, represented by the formula(I), (b) a polymeric unit, derived from 3-hydroxy-1-adamantyl (meth)acrylate, represented by the formula (II), (c) a polymeric unit, derived from an alicyclic olefin, represented by the formula(III):

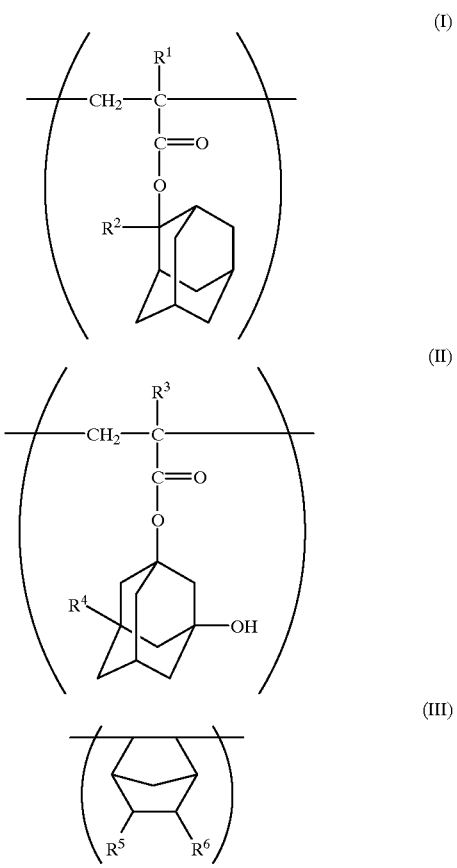

wherein $R^1$ and $R^3$ each independently represent hydrogen or methyl, $R^2$ represents alkyl, $R^4$ represents hydrogen or hydroxyl, and $R^5$ and $R^6$ each independently represent hydrogen, alkyl having 1 to 3 carbon atoms, hydroxyalkyl having 1 to 3 carbon atoms, carboxyl, cyano or a group represented by —COOR$^7$, wherein $R^7$ represents an alcohol residue, or $R^5$ and $R^6$ together form a carboxylic acid anhydride residue represented by —C(=O)OC(=O)—, and (d) a polymeric unit derived from unsaturated dicarboxylic acid anhydride selected from maleic anhydride and itaconic anhydride; and an acid generating agent (Y).

DETAILED DESCRIPTION OF THE PREFERRED EMBODIMENTS $R^1$ in the formula (I) and $R^3$ in the formula (II) is hydrogen or alkyl. It is preferred that at least one of $R^1$ and $R^3$ is hydrogen, since resin (X) having a polymeric unit derived acrylate exhibits more remarkable improving effects of adhesion to a substrate and dry-etching resistance than the resin not having a polymeric unit derived acrylate. $R^4$ represents alkyl having 1 to 4 carbon atoms. It is usually advantageous that the alkyl represented by $R^4$ is straight chain, although the alkyl may be branched. Specific examples of the alkyl include methyl, ethyl, propyl, isopropyl and butyl. Particularly, ethyl is preferred considering balance of sensitivity and heat resistance.

Examples of monomers used for deriving the polymeric unit of formula (I) include 2-methyl-2-adamantyl acrylate, 2-methyl-2-adamantyl methacrylate, 2-ethyl-2-adamantyl acrylate, 2-ethyl-2-adamantyl methacrylate and 2-n-butyl-2-adamantyl methacrylate. These monomers can be produced, for example, by reacting corresponding 2-methyl-2-adamantanols and (meth)acrylic acids.

Examples of monomers used for deriving the polymeric unit of formula (II) include 3-hydroxy-1-adamantyl acrylate, 3-hydroxy-1-adamantyl methacrylate, 3,5-dihydroxy-1-adamantyl acrylate and 3,5-dihydroxy-1-adamantyl methacrylate. These monomers can be produced, for example, by reacting corresponding hydroxyl adamantans and (meth)acrylic acids (JP-A-63-33350).

$R^5$ and $R^6$ in the formula(III) each independently represent hydrogen, alkyl having 1 to 3 carbon atoms, hydroxyalkyl having 1 to 3 carbon atoms, carboxyl, cyano or a carboxylate residue represented by $—COOR^7$, wherein $R^7$ represents an alcohol residue. Alternatively, $R^5$ and $R^6$ may together form a carboxylic acid anhydride residue represented by $—C(=O)OC(=O)—$. Examples of the alkyl represented by $R^5$ or $R^6$ include methyl, ethyl and propyl. Examples of the hydroxyalkyl represented by $R_5$ and $R_6$ include hydroxymethyl and 2-hydroxyethyl. Examples of the alcohol residue represented by $R^7$ include unsubstituted or substituted alkyl having about 1 to 8 carbon atoms and 2-oxoxolane-3- or -4-yl. Examples of the substituents of the substituted alkyl include hydroxyl and an alicyclic hydrocarbon residue. Specific examples of the carboxylate residue, $—COOR^7$, represented by $R^5$ and $R^6$ include methoxycarbonyl, ethoxycarbonyl, 2-hydroxyethoxycarbonyl, tert-butoxycarbonyl, 2-oxoxolane-3-yloxycarbonyl, 2-oxoxolane-4-yloxycarbonyl, 1,1,2-trimethylpropoxycarbonyl, 1-cyclohexyl-1-methylethoxycarbonyl, 1-(4-methylcyclohexyl)-1-methylethoxycarbonyl, and 1-(1-adamantyl)-1-methylethoxycarbonyl.

Examples of monomers used for deriving the polymeric unit of formula (III) include 2-norbornene, 2-hydroxy-5-norbornene, 5-norbornene-2-carboxylic acid, methyl 5-norbornene-2-carboxylate, t-butyl 5-norbornene-2-carboxylate, 1-cyclohexyl-1-methylethyl 5-norbornene-2-carboxylate, 1-(4-methylcyclohexyl)-1-methylethyl 5-norbornene-2-carboxylate, 1-(4-hydroxylcyclohexyl)-1-methylethyl 5-norbornene-2-carboxylate, 1-methyl-1-(4-oxocyclohexyl)ethyl 5-norbornene-2-carboxylate, 1-(1-adamantyl)-1-methylethyl 5-norbornene-2-carboxylate, 1-methylcyclohexyl 5-norbornene-2-carboxylate, 2-methyl-2-adamantyl 5-norbornene-2-carboxylate, 2-ethyl-2-adamantyl 5-norbornene-2-carboxylate, 2-hydroxyl-1-ethyl 5-norbornene-2-carboxylate, 5-norbornene-2-methanol and 5-norbornene-2,3-dicarboxylic acid anhydride.

The polymeric unit derived from unsaturated dicarboxylic acid anhydride selected from maleic anhydride and itaconic anhydride is represented by the following formula (IV) or (V):

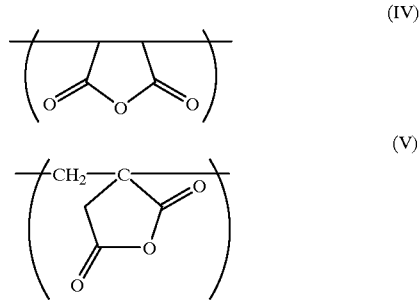

The resin (X) comprised in the resist composition of the present invention may optionally has another polymeric unit in addition to a polymeric unit represented by the formula(I), a polymeric unit represented by the formula(II), a polymeric unit represented by the formula(III) and a polymeric unit derived from unsaturated dicarboxylic acid anhydride selected from maleic anhydride and itaconic anhydride.

Usually, resins used in chemically amplified positive resist composition, per se, is insoluble or slightly soluble in alkali but becomes soluble in alkali when subjected to an action of acid, since a part of groups in the resin is cleaved by the action of acid. In the resin (X) comprised in the resist composition of the present invention, the ester group in the polymeric unit of formula (I) is cleaved by the action of acid, and the resin (X) becomes soluble in alkali. Therefore, the resist composition of the present invention functions as positive type. If desired, the resin (X) may further have another polymeric unit cleavable by the action of acid.

Various kinds of carboxylic acid ester groups may be a group cleavable by the action of acid in such another polymeric unit. Examples of the carboxylic acid ester groups include alkyl esters having about 1 to 6 carbon atoms such as tert-butylester, acetal type esters such as methoxymethylester, ethoxymethylester, 1-ethoxyethylester, 1-isobutoxyethylester, 1-isopropoxyethylester, 1-ethoxypropylester, 1-(2-methoxyethoxy)ethylester, 1-(2-acetoxyethoxy)ethylester, 1-[2-(1-adamantyloxy)ethoxy]ethylester, 1-[2-(1-adamantancarbonyloxy)ethoxy]ethylester, tetrahydro-2-furylester and tetrahydro-2-pyranylester, and alicyclic ester such as isobornylester. Monomers used for deriving such the carboxylic acid ester groups may be acrylic type monomer, such as acrylate and methacrylate, alicyclic type monomers bonding to a carboxylic acid ester group, such as norbornene carboxylate, tricyclodecene carboxylic acid ester and tetracyclodecene carboxylic acid ester, and alicyclic acid esters in which an acrylic acid or amethacrylic acid and an alicyclic group form an ester group, such as those described in Journal of Photopolymer Science and Technology, vol. 9, No. 3, pages 447–456 (1996) by Iwasa et al.

The resin (X) comprised in the resist composition of the present invention can be produced by a copolymerization of 2-alkyl-2-adamantyl (meth)acrylate from which a polymeric unit of formula(I) is derived; 3-hydroxy-1-adamantyl (meth)acrylate from which a polymeric unit of formula(II) is derived; an alicyclic olefin from which a polymeric unit of formula(III) is derived; and unsaturated dicarboxylic acid anhydride selected from maleic anhydride and itaconic anhydride; and optional monomers used if desired.

It is usually preferred that amount of the 2-alkyl-2-adamantyl (meth)acrylate is 5 to 60% by mol, amount of the 3-hydroxy-1-adamantyl (meth)acrylate is 5 to 50% by mol, and total amount of the alicyclic olefin and the unsaturated dicarboxylic acid anhydride is 10 to 90% by mol based on total amount of the all monomers used in the copolymerization, although the preferable ranges may vary depending on the kind of radiation used for patterning exposure and the kind of the optional monomers used if desired. Usually, the alicyclic olefin and the unsaturated dicarboxylic acid anhydride form an alternating copolymer.

It is advantageous that total amount of the 2-alkyl-2-adamantyl (meth)acrylate, the alicyclic olefin and the unsaturated dicarboxylic acid anhydride is 40% by mol or more, more preferably 50% by mol or more, based on total amount of the all monomers including the optional monomers used in the copolymerization. The amount of the 3-hydroxy-1-adamantyl (meth)acrylate from which a polymeric unit of formula(II) is derived is preferably 5–40% by mol based on total amount of the all monomers used in the copolymerization.

The copolymerization can be conducted according to a conventional method. For example, the resin (X) can be obtained by dissolving the monomers in an organic solvent, then conducting a polymerization reaction in the presence of a polymerization initiator, such as an azo compound. Examples of the azo compound include 2,2'-azobisisobutyronitrile and 2,2'-azobis(2-methylpropionate). It is advantageous that the reaction product is purified by re-precipitation or the like, after completion of the polymerization reaction.

The acid generating agent which is another component is decomposed to generate an acid by irradiating the component itself or a resist composition including the component with radioactive rays such as light and an electron beam. The acid generated from the acid generating agent acts on the resin to cleave the group which is to be cleaved by the action of an acid present in the resin. Examples of such acid generating agents include onium salt compounds, organic halogen compounds, sulfone compounds, and sulfonate compounds. Specifically, the following compounds can be mentioned:

diphenyliodonium trifluoromethanesulfonate,
4-methoxyphenylphenyliodonium hexafluoroantimonate,
4-mthoxyphenylphenyliodonium trifluoromethanesulfonate,
bis(4-tert-butylphenyl)iodonium tetrafluoroborate,
bis(4-tert-butylphenyl)iodonium hexafluorophosphate,
bis(4-tert-butylphenyl)iodonium hexafluoroantimonate,
bis (4-tert-butylphenyl) iodonium trifluoromethanesulfonate,
triphenylsulfonium hexafluorophosphate,
triphenylsulfonium hexafluoroantimonate,
triphenylsulfonium trifluoromethanesulfonate,
4-methoxyphenyldiphenylsulfonium hexafluoroantimonate,
4-methoxyphenyldiphenylsulfonium trifluoromethanesulfonate,
p-tolyldiphenylsulfonium trifluoromethanesulfonate,
p-tolyldiphenylsulfonium perfluorobutanesulfonate,
p-tolyldiphenylsulfonium perfluorooctanesulfonate,
2,4,6-trimethylphenyldiphenylsulfonium trifluoromethanesulfonate,
4-tert-butylphenyldiphenylsulfonium trifluoromethanesulfonate,
4-phenylthiophenyldiphenylsulfonium hexafluorophosphate,
4-phenylthiophenyldiphenylsulfonium hexafluoroantimonate,
1-(2-naphthoylmethyl)thiolanium hexafluoroantimonate,
1-(2-naphthoylmethyl) thiolanium trifluoromethanesulfonate,
4-hydroxy-1-naphthyldimethylsulfonium hexafluoroantimonate,
4-hydroxy-1-naphthyldimethylsulfonium trifluoromethanesulfonate,
2-methyl-4,6-bis(trichloromethyl)-1,3,5-triazine,
2,4,6-tris(trichloromethyl)-1,3,5-triazine,
2-phenyl-4,6-bis(trichloromethyl)-1,3,5-triazine,
2-(4-chlorophenyl)-4,6-bis(trichloromethyl)-1,3,5-triazine,
2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolane-5-yl)-4,6-bis(trichloromethyl)-1,3,5-triazine,
2-(4-methoxystyryl)-4,6-bis(trichloromethyl)-1,3,5-triazine,
2-(3,4,5-trimethoxystyryl)-4,6-bis(trichloromethyl)-1,3,5-triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine,
2-(2-methoxystyryl)-4,6-bis(trichloromethyl)-1,3,5-triazine,
2,(4-butoxystyryl)-4,6-bis(trichloromethyl)-3,5-triazine,
2-(4-pentyloxystyryl)-4,6-bis(trichloromethyl)-1,3,5-triazine,
diphenyl disulfone,
di-p-tolyl disulfone,
bis(phenylsulfonyl) diazomethane,
bis (4 -chlorophenylsulfonyl )diazomethane,
bis (p-tolylsulfonyl)diazomethane,
bis (4 -tert -butylphenylsulfonyl) diazomethane,
bis(2,4-xylylsulfonyl)diazomethane,
bis(cyclohexylsulfonyl)diazomethane,
(benzoyl)(phenylsulfonyl)diazomethane,
1-benzoyl-1-phenylmethyl p-toluenesulfonate (so-called benzointosylate),
2-benzoyl-2-hydroxy-2-phenylethyl p-toluenesulfonate (so-called α-methylolbenzointosylate),
1,2,3-benzenetriyl trimethanesulfonate,
2,6-dinitrobenzyl p-toluenesulfonate,
2-nitrobenzyl p-toluenesulfonate,
4-nitrobenzyl p-toluenesulfonate,
N-(phenylsulfonyloxy)succinimide,
N-(trifluoromethylsulfonyloxy)succinimide,
N-(trifluoromethylsulfonyloxy)phthalimide,
N-(trifluoromethylsulfonyloxy)-5-norbornene-2,3-dicarboxy imide,
N-(trifluoromethylsulfonyloxy)naphthalimide,
N-(10-camphorsulfonyloxy)naphthalimide, and the like.

It is also known that, generally in a chemical amplifying type positive resist composition, performance deterioration due to the deactivation of an acid associated with leaving after exposure can be reduced by adding basic compounds, especially basic nitrogen-containing organic compounds such as amines as quenchers. It is also preferable in the present invention that such basic compounds are added. Concrete examples of the basic compounds to be used as quenchers include the ones represented by the following formulae:

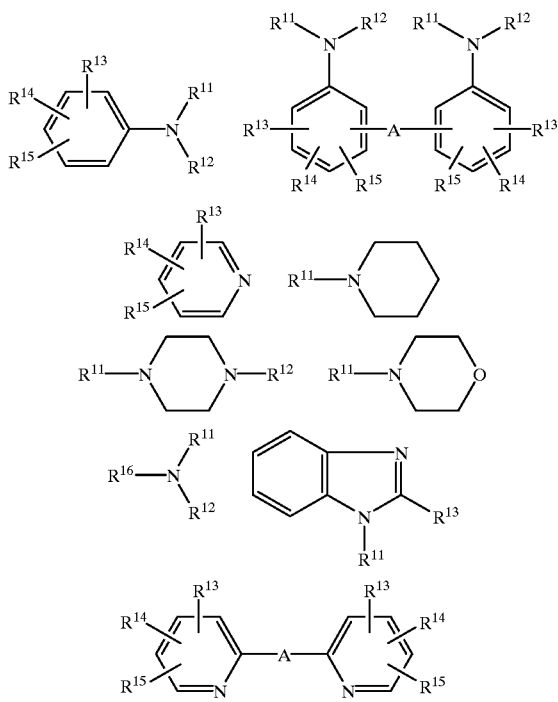

wherein $R^{11}$ and $R^{12}$ represent, independently each other, hydrogen, cycloalkyl, aryl or alkyl which may be optionally substituted with a hydroxyl; $R^{13}$, $R^{14}$ and $R^{15}$, which are same or different from each other, represent hydrogen, cycloalkyl, aryl, alkoxy or alkyl which may be optionally substituted with a hydroxyl; $R^{16}$ represents cycloalkyl or alkyl which may be optionally substituted with a hydroxyl; A represents alkylene, carbonyl or imino. The alkyl represented by $R^{11}$ to $R^{16}$ and alkoxy represented by $R^{13}$ to $R^{15}$ may have about 1 to 6 carbon atoms. The cycloalkyl may have about 5 to 10 carbon atoms and the aryl may have about 6 to 10 carbon atoms. The aryl represented by $R^{11}$ to $R^{15}$ may have about 6 to 10 carbon atoms. The alkylene represented by A may have about 1 to 6 carbon atoms and may be straight-chained or branched.

The resist composition of the present invention preferably contains the resin(X) in an amount in the range of 80 to 99.9% by weight, and the acid generating agent(Y) in an of 0.1 to 20% by weight based on the total amount of the resin(X) and the acid generating agent(Y). When a basic compound is used as a quencher, it is preferably contained in an amount in the range of 0.0001 to 0.1% by weight based on the total solid component weight of the resist composition. The composition may also contain, if required, various additives such as sensitizers, dissolution inhibitors, resins other than resin(X), surfactants, stabilizers, and dyes so far as the objets of the present invention is not harmed.

The resist composition of the present invention generally becomes a resist solution in the state in which the above-described components are dissolved in a solvent to be applied on a substrate such as a silicon wafer. The solvent used herein may be one which dissolves each component, has an appropriate drying rate, and provides a uniform and smooth coating after evaporation of the solvent, and can be one which is generally used in this field. Examples thereof include glycol ether esters such as ethylcellosolve acetate, methylcellosolve acetate, and propylene glycol monomethyl ether acetate; esters such as ethyl lactate, butyl acetate, amyl acetate, and ethyl pyruvate; ketones such as acetone, methyl isobutyl ketone, 2-heptanone, and cyclohexanone; and cyclic esters such as γ-butyrolactone. These solvents can be used alone or in combination of two or more thereof.

The resist film applied on a substrate, and dried is subjected to an exposure treatment for patterning. Then, after a heat-treatment for promoting a protecting deblocking reaction, development by an alkali developer is conducted. The alkali developer herein used can be various kinds of alkaline aqueous solutions used in this field. In general, an aqueous solution of tetramethylammoniumhydroxide or (2-hydroxyethyl)trimethylammoniumhydroxide (so-called colline) is often used.

The present invention will be described in more detail by way of examples, which should not be construed as limiting the scope of the present invention. All parts in examples are by weight unless otherwise stated. The weight-average molecular weight is a value determined from gel permeation chromatography using polystyrene as a reference standard.

Monomer Synthesis Example 1

Synthesis of 2-methyl-2-adamantyl acrylate 166 g of 2-Methyl-2-adamantanol, 303 g of triethylamine and 500 g of methylisobutyl ketone were mixed by stirring at 60° C. While stirring, 136 g of acrylic acid chloride was added dropwise to the mixture. After completion of the dropwise addition, the mixture was stirred for six more hours. Then, extraction and distillation were conducted to obtain 2-methyl-2-adamantyl acrylate at the yield of 92%.

Monomer Synthesis Example 2

Synthesis of 2-ethyl-2-adamantyl methacrylate 180 g of 2-Ethyl-2-adamantanol, 303 g of triethylamine and 500 g of methylisobutyl ketone were mixed by stirring at 90° C. While stirring, 157 g of methacrylic acid chloride was added dropwise to the mixture. After completion of the dropwise addition, the mixture was further stirred for 72 hours. Then, extraction and distillation were conducted to obtain 2-ethyl-2-adamantyl methacrylate at the yield of 60%.

Monomer Synthesis Example 3

Synthesis of 2-ethyl-2-adamantyl acrylate 180 g of 2-Ethyl-2-adamantanol, 303 g of triethylamine and 500 g of methylisobutyl ketone were mixed by stirring at 40° C. While stirring, 136 g of acrylic acid chloride was added dropwise to the mixture. After completion of the dropwise addition, the mixture was stirred for three more hours. Then, extraction and distillation were conducted to obtain 2-ethyl-2-adamantyl acrylate at the yield of 80%.

Resin Synthesis 1

Synthesis of a 2-ethyl-2-adamantyl methacrylate/3-hydroxy-1-adamantyl acrylate/norbornene/maleic anhydride copolymer: Resin A1

In a reaction vessel were charged 10.0 g of 2-ethyl-2-adamantyl methacrylate, 9.0 g of 3-hydroxy-1-adamantyl acrylate, 5.7 g of norbornene and 5.9 g of maleic anhydride (molar ratio of 2:2:3:3). Thereto, methylisobutyl ketone, the amount thereof being two times by weight based on the total amount of the monomers, was added to form a monomer solution, and the resultant solution was heated to 80° C. under nitrogen atmosphere. Then, 2,2'- azobisisobutyronitrile, the amount thereof being 3% by mol based on the total amount of the monomers, was added, and the resulting solution was further stirred for about 15 hours at 80° C. Thereafter, the reaction solution was mixed with a large quantity of methanol to precipitate the polymer product, which was then filtered. The polymer product obtained by the filtration was dissolved in methylisobutyl ketone, and the obtained solution was mixed with a large quantity of methanol to re-precipitate the polymerproduct, which was then filtered. The above procedure from dissolution of the polymer product to re-precipitation was repeated two more times in order to purify the product. 17.1 g of a copolymer having weight-average molecular weight of about 12,160 and a degree of dispersion of 1.90 was obtained (yield of 55.9%). The copolymer thus obtained referred to as resin Al.

Resin Synthesis 2

Synthesis of a 2-ethyl-2-adamantyl acrylate/3-hydroxy-1-adamantyl acrylate /norbornene/maleic anhydride copolymer: Resin A2

In a reaction vessel were charged 10.0 g of 2-ethyl-2-adamantyl acrylate, 9.5 g of 3-hydroxy-1-adamantyl acrylate, 6.0 g of norbornene and 6.3 g of maleic anhydride (molar ratio of 2:2:3:3). Thereto, methylisobutylketone, the amount thereof being two times by weight based on the total amount of the monomers, was added to form a monomer solution, and the resultant solution was heated to 80° C. under nitrogen atmosphere. Then, 2,2'-azobisisobutyronitrile, the amount thereof being 3% by mol based on the total amount of the monomers, was added, and the resulting solution was further stirred for about 15 hours at 80 ° C. Thereafter, the reaction solution was mixed with a large quantity of heptane to precipitate the polymer product, which was then filtered. The polymer product obtained by the filtration was dissolved in methylisobutyl ketone, and the obtained solution was mixed with a large quantity of heptane to re-precipitate the polymer product, which was then filtered. The above procedure from dissolution of the polymer product to re-precipitation was repeated once more in order to purify the product. 21.2 g of a copolymer having weight-average molecular weight of about 6,090 and a degree of dispersion of 1.71 was obtained (yield of 66.6%). The copolymer thus obtained referred to as resin A2.

Resin Synthesis 3

Synthesis of a 2-methyl-2-adamantyl acrylate/3-hydroxy-1-adamantyl acrylate /norbornene/maleic anhydride copolymer: Resin A3

In a reaction vessel were charged 20.0 g of 2-methyl-2-adamantyl acrylate, 10.2 g of 3-hydroxy-1-adamantyl acrylate, 4.3 g of norbornene and 4.5 g of maleic anhydride (molar ratio of 4:2:2:2). Thereto, tetrahydrofuran, the amount thereof being two times by weight based on the total amount of the monomers, was added to form a monomer solution, and the resultant solution was heated to 65° C. under nitrogen atmosphere. Then, 2,2'-azobisisobutyronitrile, the amount thereof being 3% by mol based on the total amount of the monomers, was added, and the resulting solution was further stirred for about 15 hours at 67° C. Thereafter, the reaction solution was mixed with a large quantity of n-heptane to precipitate the polymer product, which was then filtered. The polymer product obtained by the filtration was dissolved in tetrahydrofuran, and the obtained solution was mixed with a large quantity of n-heptane to re-precipitate the polymer product, which was then filtered. The above procedure from dissolution of the polymer product to re-precipitation was repeated once more in order to purify the product. 19.6 g of a copolymer having weight-average molecular weight of about 8,270 and a degree of dispersion of 1.61 was obtained (yield of 50.2%). The copolymer thus obtained referred to as resin A3.

Resin Synthesis 4

Synthesis of a 2-methyl-2-adamantyl acrylate/3-hydroxy-1-adamantyl acrylate /norbornene/maleic anhydride copolymer: Resin A4

In a reaction vessel were charged 20.0 g of 2-methyl-2-adamantylacrylate, 5.0 g of 3-hydroxy-1-adamantyl acrylate, 5.3 g of norbornene and 5.6 g of maleic anhydride (molar ratio of 4:1:2.5:2.5). Thereto, methylisobutyl ketone, the amount thereof being two times by weight based on the total amount of the monomers, was added to form a monomer solution, and the resultant solution was heated to 70° C. under nitrogen atmosphere. Then, 2,2'-azobisisobutyronitrile, the amount thereof being 3% by mol based on the total amount of the monomers, was added, and the resulting solution was further stirred for about 15 hours at 70° C. Thereafter, the reaction solution was mixed with a large quantity of methanol to precipitate the polymer product, which was then filtered. The polymer product obtained by the filtration was dissolved in methylisobutyl ketone, and the obtained solution was mixed with a large quantity of methanol to re-precipitate the polymer product, which was then filtered. The above procedure from dissolution of the polymer product to re-precipitation was repeated once more in order to purify the product. 23.9 g of a copolymer having weight-average molecular weight of about 13,840 and a degree of dispersion of 1.87 was obtained (yield of 66.1%). The copolymer thus obtained referred to as resin A4.

Resin Synthesis 5

Synthesis of a tert-butyl 5-norbornene-2-carboxylate/maleic anhydride copolymer: Resin AX In reaction vessel, 15.0 g ( 77.2 m mol) of tert-butyl 5-norbornene-2-carboxylate,7.57 g (77.2 m mol) of maleic anhydride and 45.0 g of 1,4-dioxane were mixed to form a monomer solution, and the resultant solution was heated to 80° C. under nitrogen atmosphere. Thereto, 0.25 g of 2,2'-azobisisobutyronitrile was added, and the resulting solution was further stirred for about 48 hours. After cooling, the reaction solution was mixed with a large quantity of heptane to precipitate the polymer product, which was then filtered. The polymer product obtained by the filtration was dissolved in 1,4-dioxane, and the obtained solution was mixed with a large quantity of heptane to re-precipitate the polymer product, which was then filtered. The above procedure from dissolution of the polymer product to re-precipitation was repeated once more in order to purify the product. A copolymer having weight-average molecular weight of about 4,750 and a degree of dispersion of 1.6 was obtained. The copolymer thus obtained referred to as resin AX.

Resin Synthesis 6

Synthesis of a 2-methyl-2-adamantyl acrylate/ norbornene/maleic anhydride copolymer: Resin AY In a reaction vessel were charged 58.2 g of 2-methyl-2-adamantyl acrylate, 18.8 g of norbornene and 19.6 g of maleic anhydride (molar ratio of 4:3:3). Thereto, tetrahydrofuran, the amount thereof being two times by weight based on the total amount of the monomers, was added to form a monomer solution, and the resultant solution was heated to 65° C. under nitrogen atmosphere. Then, 2,2'-azobisisobutyronitrile, the amount thereof being 3% by mol based on the total amount of the monomers, was added, and the resulting solution was further stirred for about 20 hours at 65° C. Thereafter, the reaction solution was mixed with a large quantity of methanol to precipitate the polymer product, which was then filtered. The polymer product obtained by the filtration was dissolved in tetrahydrofuran, and the obtained solution was mixed with a large quantity of methanol to re-precipitate the polymer product, which was then filtered. The above procedure from dissolution of the polymer product to re-precipitation was repeated once more in order to purify the product. 61.9 g of a copolymer having weight-average molecular weight of about 4,710 and a degree of dispersion of 1.49 was obtained (yield of 64.1%). The copolymer thus obtained referred to as resin AY.

Resin Synthesis 7

Synthesis of a 2-methyl-2-adamantyl acrylate/norbornene/maleic anhydride copolymer: Resin AZ In a reaction vessel were charged 15.0 g of 2-methyl-2-adamantyl acrylate, 12.9 g of norbornene and 13.5 g of maleic anhydride (molar ratio of 2:4:4). Thereto, methylisobutyl ketone, the amount thereof being two times by weight based on the total amount of the monomers, was added to form a monomer solution, and the resultant solution was heated to 80° C. under nitrogen atmosphere. Then, 2,2'-azobisisobutyronitrile, the amount thereof being 3% by mol based on the total amount of the monomers, was added, and the resulting solution was further stirred for about 8 hours at 80° C. Thereafter, the reaction solution was mixed with a large quantity of iso-propanol to precipitate the polymer product, which was then filtered. The polymer product obtained by the filtration was dissolved in tetrahydrofuran, and the obtained solution was mixed with a large quantity of iso-propanol to re-precipitate the polymer product, which was then filtered. The above procedure from dissolution of the polymer product to re-precipitation was repeated once more in order to purify the product. 26.5 g of a copolymer having weight-average molecular weight of about 7,260 and a degree of dispersion of 1.49 was obtained (yield of 64.0%). The copolymer thus obtained referred to as resin AZ.

Resin Synthesis 8

Synthesis of a 2-ethyl-2-adamantyl methacrylate/3-hydroxy-1-adamantyl acrylate/norbornene/maleic anhydride copolymer: Resin A5

In a reaction vessel were charged 10.0 g of 2-ethyl-2-adamantyl methacrylate, 9.0 g of 3-hydroxy-1-adamantyl acrylate, 5.7 g of norbornene and 5.9 g of maleic anhydride (molar ratio of 2:2:3:3). Thereto, methylisobutyl ketone, the amount thereof being two times by weight based on the total amount of the monomers, was added to form a monomer solution, and the resultant solution was heated to 80° C. under nitrogen atmosphere. Then, 2,2'-azobisisobutyronitrile, the amount thereof being 1% by mol based on the total amount of the monomers, was added, and the resulting solution was further stirred for about 15 hours at 80° C. Thereafter, the reaction solution was mixed with a large quantity of methanol to precipitate the polymer product, which was then filtered. The polymer product obtained by the filtration was dissolved in methylisobutyl ketone, and the obtained solution was mixed with a large quantity of methanol to re-precipitate the polymerproduct, which was then filtered. The above procedure from dissolution of the polymer product to re-precipitation was repeated two more times in order to purify the product. 12.2 g of a copolymer having weight-average molecular weight of about 7,000 and a degree of dispersion of 1.60 was obtained (yield of 40.0%). The copolymer thus obtained referred to as resin A5.

Resist compositions are prepared using the resins obtained in the above Resin Synthesis examples and the following acid generating agents and quenchers.

Acid Generating Agent

B1:p-tolyldiphenylsulfonium trifluoromethanesulfonate
B2:p-tolyldiphenylsulfonium trifluorobutanesulfonate
B3:p-tolyldiphenylsulfonium perfluorooctanesulfonate
B4:cyclohexylmethyl(2-oxocyclohexyl) sulfonium trifluoromethanesulfonate Quencher
C1:2,6-diisopropylaniline
C2:2,6-lutidine Examples and Comparative Examples Components listed below were mixed and dissolved. The resultant solution was filtered through a fluorine resin filter having a pore diameter of 0.2 $\mu$m to give a resist solution. In Example 3, two kinds of acid generating agents and two kinds of quenchers were used in combination.
Resin (listed in Table 1) 10 parts
Acid generating agent
  (Amounts and kinds thereof are listed in Table 1):
Quencher
  (Amounts and kinds thereof are listed in Table 1):
Solvent:
  propyleneglycol monomethylether acetate 57 parts
  γ-butyrolactone 3 parts A silicon wafer treated with hexamethyldisilazane (Contact angle to water:60°) was coated with a composition "DUV-30J-14" (a composition for forming organic reflection-preventing membrane, manufactured by Brewer Co. Ltd.) and baked under conditions of 215° C. for 60 seconds so that an organic reflection-preventing membrane having a thickness of 1,600 angstrom was formed on the wafer. On the silicon wafer thus prepared, was applied the resist solution obtained above was applied by spin-coating so that the film thickness after drying was 0.39 $\mu$m (in all Examples and Comparative examples except for Example 4) or 0.335 $\mu$m(in Example 4). After applying the resist solution, the wafer was pre-baked on a direct hotplate at a temperature shown in Table 1, column "PB" for 60 seconds.

The wafer having a resist film formed thereon was irradiated with an ArF eximer stepper ["NSR-ArF", manufactured by Nikon, NA=0.55, σ=0.6] through a line-and-space pattern, changing the exposure amount stepwise. The exposed wafer was subjected to post-exposure baking (PEB) on a hot plate at a temperature shown in Table 1, column "PEB" for 60 seconds. Then the wafer was subjected to paddle development with 2.38% by weight aqueous tetramethyl ammonium hydroxide solution for 60 seconds.

The developed bright field pattern formed on a substrate with an organic reflection-preventing membrane was observed by a scanning electron microscope and assessed for the effective sensitivity and the resolution by the following methods:

Effective sensitivity: This is expressed in the minimum amount of exposure which gave 1:1 line-and-space pattern of 0.18 μm.

Resolution: This is expressed in the minimum size which gave line-and-space pattern spitted at the exposure amount of the effective sensitivity.

Adhesion to a substrate was also evaluated by observing the pattern formed on the wafer with optical microscope according to the following criteria:

⊚:Excellent in peeling at development (fine patterns are hardly peeled even at high exposure amount.)
○:Peeling of large patterns are not observed, though peeling of some fine patterns are observed at high exposure amount.
x:Resist patterns including large patterns are completely peeled The results are shown in Table 2.

A bright field pattern is obtained by exposure and development through a reticle comprising an outer frame formed of a chromium layer (lightproof layer) and linear chromium layers (lightproof layers) formed on a surface of a glass substrate (light-transmissive portion). Accordingly, after exposure and development, portions of the resist layer surrounding a line and space pattern is removed with a portion of the resist layer corresponding to the outer frame being left outside the line and space pattern.

TABLE 1

|  | Resin | Acid Generating agent (parts) | Quencher (parts) | PB (° C.) | PEB (° C.) |
|---|---|---|---|---|---|
| Example 1 | A1 | B1(0.1) | C1 (0.0075) | 140 | 130 |
| Example 2 | A1 | B2(0.15) | C1 (0.0075) | 130 | 130 |
| Example 3 | A1 | B3(0.2) | C1(0.015) | 140 | 130 |
| Example 4 | A1 | B3(0.2) B4(0.5) | C1(0.015) C2(0.01) | 110 | 115 |
| Example 5 | A2 | B3(0.2) | C1 (0.0075) | 130 | 130 |
| Example 6 | A3 | B1(0.1) | C1 (0.0075) | 140 | 130 |
| Example 7 | A4 | B1(0.1) | C1 (0.0075) | 140 | 130 |
| Example 8 | A5 | B3(0.2) | C1 (0.0075) | 120 | 120 |
| Comparative Example 1 | AX | B1(0.1) | C1 (0.0075) | 130 | 130 |
| Comparative Example 2 | AY | B1(0.1) | C1 (0.0075) | 140 | 115 |
| Comparative Example 3 | AZ | B1(0.1) | C1 (0.0075) | 140 | 130 |

TABLE 2

|  | Effective sensitivity (mJ/cm2) | Resolution (μm) | Adhesion to a substrate |
|---|---|---|---|
| Example 1 | 28 | 0.16 | ⊚ |
| Example 2 | 31 | 0.15 | ⊚ |
| Example 3 | 34 | 0.15 | ⊚ |
| Example 4 | 57 | 0.15 | ⊚ |
| Example 5 | 39 | 0.15 | ⊚ |
| Example 6 | 48 | 0.17 | ⊚ |
| Example 7 | 34 | 0.17 | ⊚ |
| Example 8 | 33 | 0.15 | ⊚ |
| Comparative Example 1 | 82 | 0.18 | X |
| Comparative Example 2 | 30 | 0.17 | ○ |

TABLE 2-continued

|  | Effective sensitivity (mJ/cm2) | Resolution (μm) | Adhesion to a substrate |
|---|---|---|---|
| Comparative Example 3 | 42 | 0.18 | ○ |

Apparent from the Tables, the resists of Examples 1–8 are not only excellent in balance of sensitivity and resolution but also particularly excellent in adhesion to a substrate. Further, they exhibit good hydrophilicity (wettablity with respect to a developer) and dry-etching resistance.

The chemical amplifying type positive resist composition of the present invention is conspicuously excellent in adhesion to a substrate, as well as good in dry-etching resistance and various resist performance characteristics such as sensitivity and resolution. Accordingly, the resist composition is suitable for use in excimer laser lithography utilizing ArF, KrF or the like, and capable of giving a resist pattern with high performance.

What is claimed is:
1. A chemically amplified positive resist composition comprising a resin (X) which, per se, is insoluble in alkali but becomes soluble in alkali when subjected to an action of acid, and has
(a) a polymeric unit, derived from 2-alkyl-2-adamantyl (meth)acrylate, represented by the formula (I),
(b) a polymeric unit, derived from 3-hydroxy-1-adamantyl (meth)acrylate, represented by the formula (II),
(c) a polymeric unit, derived from an alicyclic olefin, represented by the formula (III):

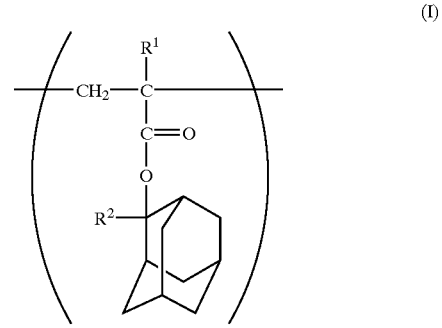

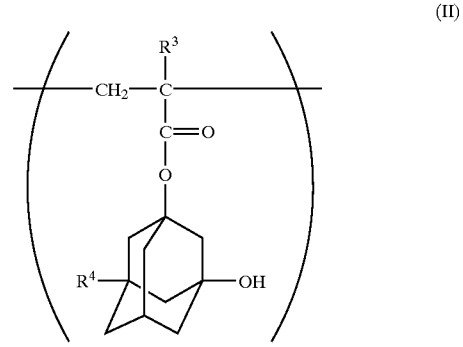

-continued

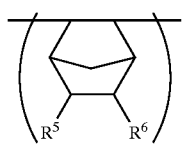

(III)

wherein $R^1$ and $R^3$ each independently represent hydrogen or methyl, $R^2$ represents alkyl, $R^4$ represents hydrogen or hydroxyl, and $R^5$ and $R^6$ each independently represent hydrogen, alkyl having 1 to 3 carbon atoms, hydroxyalkyl having 1 to 3 carbon atoms, carboxyl, cyano or a group represented by —$COOR^7$, wherein $R^7$ represents an alcohol residue, or $R^5$ and $R^6$ together form a carboxylic acid anhydride residue represented by —C(=O)OC(=O)—, and (d) a polymeric unit derived from unsaturated dicarboxylic acid anhydride selected from maleic anhydride and itaconic anhydride; and an acid generating agent (Y)

wherein said chemically amplified positive resist composition is produced by a copolymerization of monomers comprising 2-alkyl-2-adamantyl (meth)acrylate from which a polymeric unit of formula (I) is derived;

3-hydroxy-1-adamantyl (meth)acrylate from which a polymeric unit of formula (II) is derived;

an alicyclic olefin from which a polymeric unit of formula (III) is derived; and unsaturated dicarboxylic acid anhydride selected from maleic anhydride and itaconic anhydride;

wherein amount of the 2-alkyl-2-adamantyl (meth)acrylate is 5 to 60% by mol, amount of the 3-hydroxy-1-adamantyl (meth)acrylate is 5 to 50% by mol, and total amount of the alicyclic olefin and the unsaturated dicarboxylic acid anhydride is 10 to 90% by mol based on total amount of the all monomers used in the copolymerization.

2. The chemically amplified positive resist composition according to claim 1, wherein total amount of the 2-alkyl-2-adamantyl (meth)acrylate, the alicyclic olefin and the unsaturated dicarboxylic acid anhydride is 40% by mol or more based on total amount of the all monomers used in the copolymerization.

3. The chemically amplified positive resist composition according to claim 1, wherein the amount of the 3-hydroxy-1-adamantyl (meth)acrylate from which a polymeric unit of formula(II) is derived is 5–40% by mol, based on total amount of the all monomers used in the copolymerization.

* * * * *